(12) United States Patent
Teshima et al.

(10) Patent No.: US 7,674,334 B2
(45) Date of Patent: *Mar. 9, 2010

(54) ARTIFICIAL CORUNDUM CRYSTAL

(75) Inventors: Katsuya Teshima, Tokyo (JP); Shuji Oishi, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 450 days.

This patent is subject to a terminal disclaimer.

(21) Appl. No.: 10/589,635

(22) PCT Filed: Feb. 17, 2005

(86) PCT No.: PCT/JP2005/002497

§ 371 (c)(1),
(2), (4) Date: Aug. 16, 2006

(87) PCT Pub. No.: WO2005/078170

PCT Pub. Date: Aug. 25, 2005

(65) Prior Publication Data

US 2008/0227617 A1    Sep. 18, 2008

(30) Foreign Application Priority Data

Feb. 18, 2004   (JP)   .............................. 2004-041846
Feb. 18, 2004   (JP)   .............................. 2004-041849

(51) Int. Cl.
*C30B 29/20* (2006.01)

(52) U.S. Cl. .............................. 117/68; 117/71; 117/74; 117/950; 117/70

(58) Field of Classification Search .................. 117/68, 117/70, 71, 74, 950
See application file for complete search history.

(56) References Cited

FOREIGN PATENT DOCUMENTS

| | | |
|---|---|---|
| JP | 40-26525 | 11/1940 |
| JP | 40-026525 | 11/1965 |
| JP | 63-17297 | 1/1988 |
| JP | 63-017297 | 1/1988 |
| JP | 6-199597 | 7/1994 |
| JP | 06-199597 | 7/1994 |
| JP | 7-187760 | 7/1995 |

(Continued)

OTHER PUBLICATIONS

Oishi, S., et al, "Growth of emerald crystal by the evaporation of molybdenum trioxide flux," *British Ceramic Transactions*, vol. 92, No. 5, pp. 214-216, 1993.

(Continued)

*Primary Examiner*—Robert M Kunemund
(74) *Attorney, Agent, or Firm*—Ladas & Parry LLP

(57) ABSTRACT

An artificial corundum crystal which can be put into practical use at low costs, and a process for producing the same. The artificial corundum crystal contains a seed crystal and has at least one crystal face selected from a {113} face, a {012} face, a {104} face, a {110} face, a {101} face, a {116} face, a {211} face, a {122} face, a {214} face, a {100} face, a {125} face, a {223} face, a {131} face, and a {312} face. The process for producing the artificial corundum crystal an artificial corundum crystal having a hexagonally dipyramidal includes forming with a seed crystal by a flux evaporation method of heating a sample containing a raw material and a flux to precipitate a crystal and grow the crystal by use of flux evaporation as a driving force.

16 Claims, 3 Drawing Sheets

FOREIGN PATENT DOCUMENTS

| | | |
|---|---|---|
| JP | 07-187760 | 7/1995 |
| JP | 07-277893 | 10/1995 |
| JP | 7-277893 | 10/1995 |

OTHER PUBLICATIONS

Oishi, S., et al, "Flux growth of hexagonal bipyramidal ruby crystals," *Journal of the American Chemical Society*, vol. 126, No. 15, pp. 4768-4769, 2004.

Elwell, D., et al, "Crystal Growth from High-Temperature Solutions," Academic Press, Inc., Chap. 10, pp. 559-561, 1975.

Elwell D., "Ruby, Sapphire and Spinel," *Man-Made Gemstones*, Chap. 2, pp. 31-57, 1979.

Oishi, S., et al. (1993) Growth of emerald crystal by the evaporation of molybdenum trioxide flux. British Ceramic Transactions. 92:214-216.

Oishi, S. et al. (2004) Flux growth of hexagonal bipyramidal ruby crystals. Journal of American Chemical Society. 126:4768-4769.

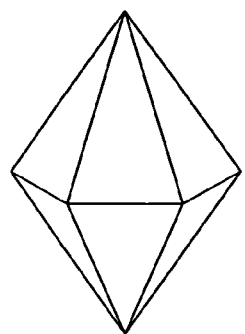
FIG. 1A
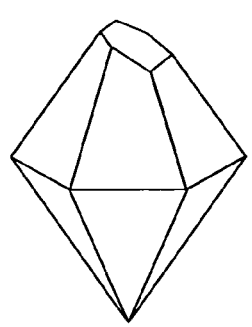
FIG. 1B
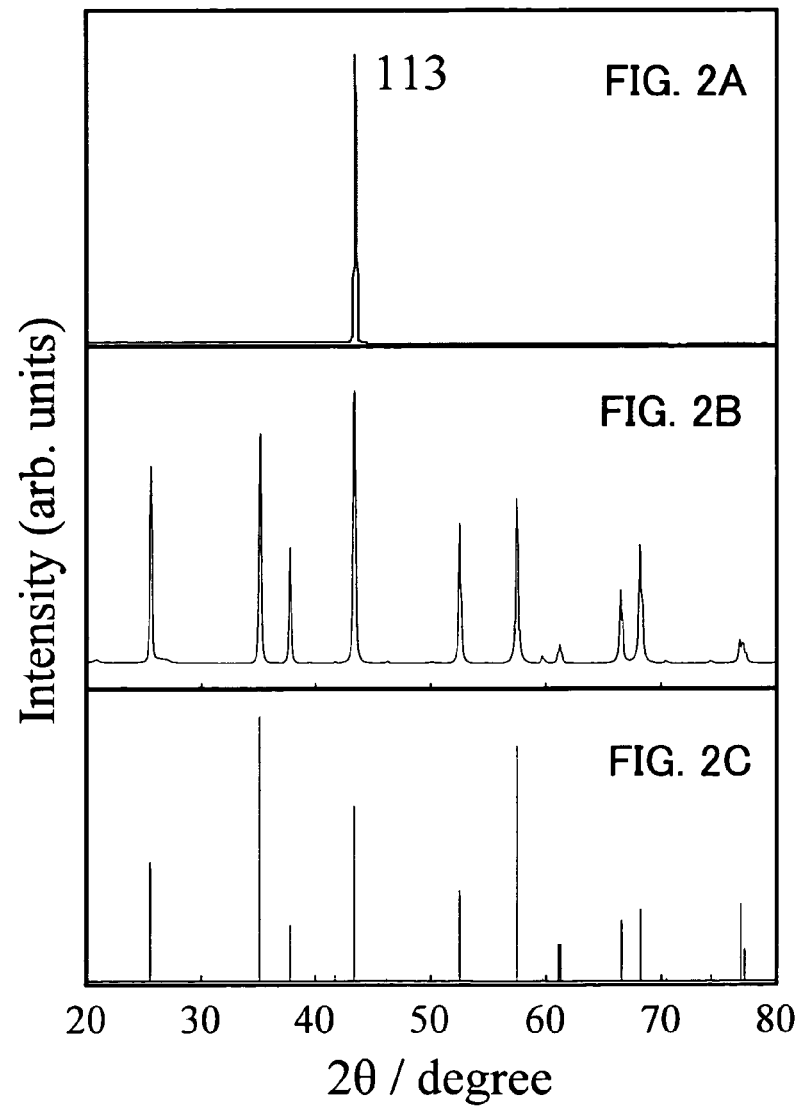

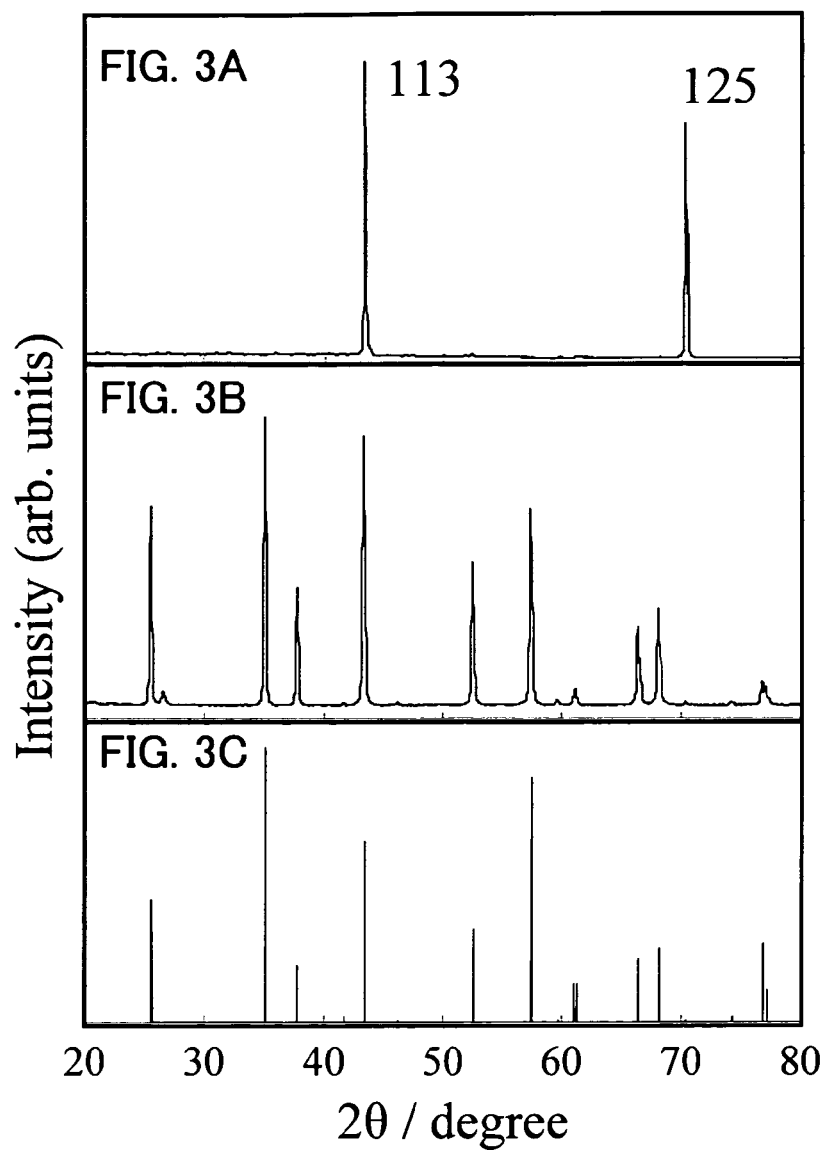
FIG. 4
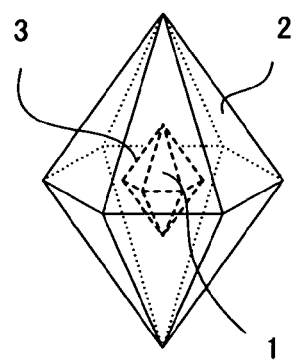

ARTIFICIAL CORUNDUM CRYSTAL

TECHNICAL FIELD

The present invention relates to an artificial corundum crystal which can be used as, for example, a laser-oscillating material, a highly hard bearing material, a standard material for physical property measurement, an ornament, a high-value added article for daily use, and the like.

BACKGROUND ART

In recent years, such monocrystals as are naturally present, which have a three-dimensional shape peculiar to the crystals, have been desired in various fields because of unknown properties thereof.

Examples of a method for producing an artificial corundum crystal include (1) the flame fusion method (Verneuil's technique) of dropping raw material powder of the corundum crystal into oxygen and hydrogen flame and simultaneously growing crystal grains; (2) the flux method of mixing raw material powder of the corundum crystal with an appropriate flux, melting the mixture in a crucible, and precipitating/growing the crystal while cooling the melted solution slowly, precipitating/growing the crystal while applying temperature gradient to the solution in the crucible, or precipitating/growing the crystal while vaporizing the flux; (3) the Czochralski method of melting raw material powder of the corundum crystal in a crucible, and pulling up the crystal from melt; and (4) a method of forming raw material powder of the corundum crystal into a shape, and then heating the shaped powder at a high temperature in a hydrogen gas atmosphere for a long time so as to sinter the powder.

In the flame fusion method (1), the growth rate of the crystal is large, so that the obtained crystal cannot be made into a high quality at ease. According to this method, a rodlike crystal is produced. Thus, at the time of actually using the crystal as a laser-oscillating material or the like, it is necessary to cut the produced rodlike crystal into a desired shape, and further the hardness of any artificial corundum crystal is high; accordingly, a problem that costs increase arises. While the artificial corundum crystal produced by this method contains no purities, natural corundum crystal contains impurities. Thus, they can easily be distinguished from each other. Consequently, the artificial corundum crystal has a drawback that it is very low in value as an ornament.

The Czochralski method (3) makes it possible to produce a crystal having a high purity. Accordingly, the crystal can be preferably used as a laser-oscillating material or the like. However, according to this method, a rodlike crystal is produced. Thus, at the time of putting the crystal into practical use, it is necessary to cut the rodlike crystal into a desired shape as described above, and further the hardness of any artificial corundum crystal is high; accordingly, a problem that costs increase arises. Furthermore, the artificial corundum crystal produced by this method has a high purity without containing any impurity, and is largely different from natural corundum crystal. Thus, the artificial corundum crystal has a drawback that the crystal is very low in value as an ornament. The Czochralski method is disclosed in, for example, the patent documents 1 and 2.

According to the method (4) of shaping followed by sintering, it is unavoidable to heat powder at high temperature for a long time. Thus, a large quantity of energy is needed, so as to cause a problem that costs increase. The method for the sintering is disclosed in, for example, the patent document 3.

It is known that according to the flux method (2), a tabular crystal can be obtained by using, as a flux, lithium oxide-lead oxide (fluoride), aluminum fluoride/sodium, lithium oxide-tungsten oxide-lead oxide (fluoride), bismuth oxide-lanthanum oxide-lead oxide (fluoride) or the like, and precipitating/growing a crystal while cooling the melted solution slowly. However, only a thin tabular crystal can be obtained. Thus, there arises a problem that costs increase when the crystal is put into practical use. The flux method is disclosed in, for example, the nonpatent literatures 1 and 2.

Among the corundum crystals, a dark red crystal to which chromium was added is generally called ruby. Since the amount of natural ruby produced is relatively low, there is need for a process for inexpensively producing an artificial corundum crystal near to natural ruby.

Patent Document 1: Japanese Patent Application Laid-Open (JP-A) No. 7-277893

Patent Document 2: JP-A No. 6-199597

Patent Document 3: JP-A No. 7-187760

Nonpatent Literature 1: Elwell D., Man-Made Gemstones, Ellis Horwood Ltd., Chichester (1979)

Nonpatent Literature 2: Elwell D., Scheel H. J., Crystal growth from high-temperature solutions, Academic Press, London (1975)

DISCLOSURE OF THE INVENTION

Problem to be Solved by the Invention

The present invention has been made in light of the above-mentioned problems, and a main object thereof is to provide an artificial corundum crystal which can be put into practical use at low costs and a process for producing the same.

Means for Solving the Problems

To achieve the above-mentioned object, the present invention provides an artificial corundum crystal containing a seed crystal and having at least one crystal face selected from the group consisting of a {113} face, a {012} face, a {104} face, a {110} face, a {101} face, a {116} face, a {211} face, a {122} face, a {214} face, a {100} face, a {125} face, a {223} face, a {131} face, and a {312} face.

The artificial corundum crystal has the above-mentioned crystal face(s) according to the invention.

Thus, when the crystal is used as a laser-oscillating material or the like, it is unnecessary to apply cutting or any other processing to the crystal. Alternatively, even when cutting or any other processing is applied thereto, the processing can be carried out by use of the crystal face(s) that the artificial corundum crystal of the invention has; therefore, the crystal has an advantage that the crystal can be put into practical use at low costs. The artificial corundum crystal of the invention has an advantage that the crystal is high in value as an ornament or the like since the crystal is a polyhedral crystal and is near natural corundum crystal. Further, the artificial corundum crystal of the invention contains a seed crystal and can be produced by using the seed crystal to produce a large-sized crystal.

The present invention further provides an artificial corundum crystal containing a seed crystal and having a dominant crystal face other than a {001} face.

According to the invention, since the artificial corundum crystal has a dominant crystal face other than a {001} face, the crystal is not a crystal originating from a conventional tabular crystal whose {001} face is a dominant face. Thus, when the crystal is used as a laser-oscillating material or the like, cutting or any other processing is not applied thereto. Alternatively, even when cutting or any other processing is applied thereto, the processing can be carried out by use of the shape of the artificial corundum crystal of the invention. Accordingly, the crystal can be put into practical use at low costs. Additionally, the artificial corundum crystal of the invention has an advantage that the crystal is high in value as an ornament or the like since the crystal is near natural corundum crystals. Further, the artificial corundum crystal of the invention contains a seed crystal and can be produced by using the seed crystal to produce a large-sized crystal as mentioned above.

It is preferred that the artificial corundum crystal of the invention is derived from a crystal having a hexagonally dipyramidal shape. This makes it possible to obtain an artificial corundum crystal having the given crystal face(s). Thus, when the crystal is used as a laser-oscillating material or the like, processing can be applied thereto in the state that the hexagonally dipyramidal shape is used. Consequently, the crystal can be put into practical use at low costs. Since the crystal originates from the hexagonally dipyramidal crystal, the crystal is a polyhedral crystal and is near natural corundum crystal. For this reason, the value thereof as an ornament or the like becomes high.

Furthermore, the artificial corundum crystal of the present invention may have chromium added as a coloring component.

The present invention further provides a process for producing an artificial corundum crystal, wherein an artificial corundum crystal having a hexagonally dipyramidal shape as its base shape is formed with a seed crystal by a flux evaporation method of heating a sample containing a raw material and a flux to precipitate a crystal and grow the crystal by use of flux evaporation as driving force.

According to the invention, the use of the flux evaporation method makes it possible to produce an artificial corundum crystal having a hexagonally dipyramidal shape as its base shape. Thus, when the crystal is used as a laser-oscillating material or the like, cutting or any other processing is not applied thereto. Alternatively, even when cutting or any other processing is applied thereto, the processing can be carried out by use of the hexagonally dipyramidal shape. Accordingly, an artificial corundum crystal capable of being put into practical use at low costs can be produced. According to the flux evaporation method, since a crystal near natural corundum crystal is obtained, the value thereof as an ornament or the like can be made high. Further, since a seed crystal is used, the seed crystal can be grown as a nucleus, thereby making it possible to produce a large-sized crystal. Furthermore, an apparatus used in the flux evaporation method is simply composed of a high-temperature furnace and a crucible. Thus, an artificial corundum crystal having hexagonally dipyramidal shape as its basic shape can easily be produced.

It is also preferred in the invention that the flux contains a molybdenum compound. The molybdenum compound is preferably a molybdenum oxide or a compound which is heated to generate the molybdenum oxide. The use of the molybdenum compound as the flux makes it possible not to produce any tabular or needle crystal but to produce a hexagonally dipyramidal crystal selectively.

In the invention, the flux may contain an evaporation inhibitor. This makes it possible to inhibit the evaporation speed of the flux so as to inhibit the generation of polynuclei and the speed of crystal growth. Consequently, a high-quality artificial corundum crystal can be produced.

It is also preferred in the invention that the evaporation inhibitor is an alkali metal compound. The alkali metal compound is preferably an alkali metal oxide, or a compound which is heated to generate the alkali metal oxide. The use of the compound makes it possible to restrain the evaporation of the flux effectively, so as to produce a high-quality and large-sized artificial corundum crystal.

It is also preferred in the invention that the mol number of the alkali metal atom in the alkali metal compound is 40% or less by mol of the total mol number of the sample. In the invention, the crystal growth is promoted by use of evaporation of the flux as a driving force; therefore, if the content of the alkali metal compound is larger than the above-mentioned range, the crystal growth may be disturbed.

It is also preferred in the invention that the mol number of the raw material is 10% or less by mol of the total mol numbers of the sample. If the content of the raw material is larger than the above-mentioned range, the raw material is not melted into the flux at ease so that the crystal growth may be disturbed.

Further, in the present invention, the seed crystal is preferably a corundum crystal. This is because by using the corundum crystal as a nucleus, an artificial corundum crystal can easily grow and a large-sized artificial corundum crystal can be easily produced.

Still furthermore, in the present invention, the raw material may contain a chromium compound. This is because when the raw material contains a chromium compound, an artificial corundum crystal to which chromium was added, similar to the natural corundum crystal, can be produced inexpensively.

EFFECT OF THE INVENTION

According to the invention, a large-sized artificial corundum crystal having a hexagonally dipyramidal shape as its base shape can be produced by the flux evaporation method using a seed crystal; can be easily processed in a laser-oscillating material or the like; and can be put into practical use at low costs. Additionally, the invention has an advantage that the crystal is high in value as an ornament or the like since a crystal near natural corundum crystal is obtained.

BRIEF DESCRIPTION OF DRAWINGS

FIGS. 1A and 1B are forms each showing an example of an artificial corundum crystal of the invention.

FIGS. 2A to 2C are graphs each showing an example of the X-ray diffraction pattern of the artificial corundum crystal of the invention.

FIGS. 3A to 3C are graphs each showing another example of the X-ray diffraction pattern of the artificial corundum crystal of the invention.

FIG. 4 is a form showing another example of the artificial corundum crystal of the invention.

Figure 5A:
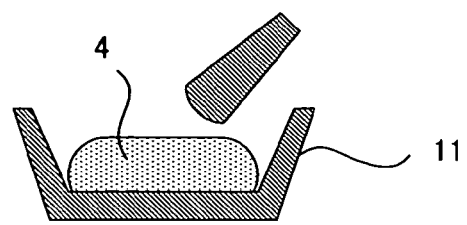
FIGS. 5A to 5D are process charts showing an example of the process of the invention for producing an artificial corundum crystal.

EXPLANATION OF REFERENCES 1, 5 . . . seed crystal
2, 6 . . . artificial corundum crystal
4 . . . sample
11 . . . mortar
12 . . . crucible
13 . . . high-temperature furnace

BEST MODE FOR CARRYING OUT THE INVENTION

The present invention includes an artificial corundum crystal and a process for producing the same. The following describes each of them in detail.

A. Artificial Corundum Crystal

First, the artificial corundum crystal of the present invention is described.

The artificial corundum crystal of the invention can be classified into two embodiments. The first embodiment is an artificial corundum crystal containing a seed crystal and having at least one crystal face selected from the group consisting of a {113} face, a {012} face, a {104} face, a {110} face, a {101} face, a {116} face, a {211} face, a {122} face, a {214} face, a {100} face, a {125} face, a {223} face, a {131} face, and a {312} face. The second embodiment is an artificial corundum crystal containing a seed crystal and having a dominant crystal face other than a {001} face.

The following describes each of the embodiments.

1. First Embodiment

The first embodiment of the artificial corundum crystal of the invention is an artificial corundum crystal containing a seed crystal and having at least one crystal face selected from the group consisting of a {113} face, a {012} face, a {104} face, a {110} face, a {101} face, a {116} face, a {211} face, a {122} face, a {214} face, a {100} face, a {125} face, a {223} face, a {131} face, and a {312} face.

Corundum crystal is described herein. Corundum crystal has a corundum structure belonging to the trigonal system. This corundum structure has the following structure: cations (Al) regularly occupy ⅔ of hexacoordinate (octahedron) positions of a substantially hexagonal-closest-packed lattice; and $AlO_6$ octahedrons, the center of each of which is a cation (Al), partially have faces in common, and are jointed to each other in a "c" axis direction. In general, the crystal is converted to an iron and titanium-added corundum crystal by partially substituting Al of corundum ($Al_2O_3$) with Fe and Ti, or to a chromium-added corundum crystal by partially substituting Al with Cr.

Corundum ($Al_2O_3$) is the most stable in alumina polymorphs. Corundum crystal having such a corundum structure has a melting point of about 2050° C., has a high hardness (Mohs hardness: 9), and is excellent in chemical resistance, abrasion resistance, and weather resistance. In a high-temperature environment also, the crystal exhibits a high electrical insulation property. Since corundum crystal has the above-mentioned nature, the crystal is used in a bearing for meters, a micro-scalpel, an optical switch element, a laser-oscillating material, and so on. Corundum crystal is converted to a crystal having a different hue by substituting Cr, Ti, Fe, or the like partially for Al of corundum ($Al_2O_3$). The resultant crystal is generally called ruby or sapphire, and is used as an ornament.

As the process for producing an artificial corundum crystal, the Czochralski method, the flame fusion method, the flux method, the sintering method, and so on are known up to the present time. The artificial corundum crystal created by the Czochralski method or the flame fusion method is yielded as a rodlike crystal. Thus, the crystal does not have a complicated shape. The artificial corundum crystal created by the sintering method is sintered after the crystal is shaped. Therefore, in this case also, the crystal does not have a complicated shape. On the other hand, according to the flux slow-cooling method, a tabular crystal is obtained, and thus the obtained artificial corundum crystal has crystal faces. However, the dominant face thereof is a {001} face.

As described above, artificial corundum crystals have been hitherto obtained as rodlike or tabular crystals. It is therefore necessary to apply cutting or some other processing thereto so as to make the crystal into a desired shape at the time of using the crystal as a laser-oscillating material or the like. As described above, artificial corundum crystals have high hardness. Consequently, an inconvenience that costs increase is caused. The artificial corundum crystal produced by the Czochralski method or the flame fusion method contains no impurities while natural corundum crystal contains impurities, and thus these can easily be distinguished from each other. Accordingly, the artificial corundum crystal is low in value as an ornament or the like.

The artificial corundum crystal in the present embodiment has given crystal face(s), and the crystal face(s) originate(s) from the hexagonally dipyramidal crystal. The hexagonally dipyramidal crystal means, for example, an artificial corundum crystal having a shape as shown in FIG. 1A. The artificial corundum crystal originates from the hexagonally dipyramidal crystal in the present embodiment; therefore, at the time of using the crystal as a laser-oscillating material, an ornament or the like, cutting or any other processing is not applied thereto. Alternatively, even if cutting or any other processing is applied thereto, the embodiment has an advantage that the crystal can be put into practical use at low costs since the processing can be performed by use of the crystal face(s) which the artificial corundum crystal of the invention has.

The above-mentioned crystal and crystal faces are each identified or measured by use of an X-ray diffractometer. At this time, in the trigonal system, "a" and "c" are set to 4.759 Å and 12.993 Å, respectively, and obtained data are compared with JCPDS No. 46-1212 in the identification. Examples of the X-ray diffraction pattern of crystal faces of the artificial corundum crystal of the present embodiment are shown in FIG. 2A and FIG. 3A. FIG. 2B and FIG. 3B are X-ray diffraction patterns measured by pulverizing the artificial corundum crystal of the embodiment in order to identify the crystal. In the embodiment, in order for the artificial corundum crystal to have the given crystal face(s), it is sufficient that for example a peak assigned to any one of the given crystal faces is detected as shown in FIG. 2A and FIG. 3A. FIGS. 2C and 3C are X-ray diffraction patterns of JCPDS No. 46-1212, and the X-ray diffraction patterns of FIGS. 2A-2C and FIGS. 3A-3C were measured using a CuK α ray.

In the invention, for example, a {101} face means all faces equivalent to a (101) face, that is, a (101) face and a (011) face, or multiples thereof, such as a (202) face, a (022) face, a (303) face, a (033) face, a (404) face, a (044) face, and other faces. The same matter is applied to the other given crystal faces.

The artificial corundum crystal of the embodiment has the given crystal face(s), thereby being distinguished from the artificial corundum crystal produced by any conventional production process. For example, the artificial corundum crystal produced by the Czochralski method does not have a complicated crystal shape and it is substantially impossible to work the crystal to have a specified crystal face even if cutting or any other processing is applied thereto. The artificial corundum crystal produced by the flux slow-cooling method is a tabular crystal, and has a {001} face as its dominant crystal face. However, it is usually impossible to work the crystal to have a crystal face originating from a hexagonally dipyramidal crystal as described above.

The artificial corundum crystal in this embodiment contains a seed crystal and can thus be a crystal produced by using the seed crystal. When the crystal is produced by using a seed crystal, there is an advantage that the crystal can grow around the seed crystal as a nucleus and to yield a large-sized crystal. Accordingly, a large-sized artificial corundum crystal can be obtained in this embodiment.

The wording "the artificial corundum crystal contains a seed crystal" means that in the artificial corundum crystal as shown in, for example, FIG. 4, there is a border 3 between a seed crystal 1 and a crystal 2 growing on the seed crystal 1 as a nucleus. The border between the seed crystal and the crystal formed around the seed crystal can be identified from its structure or composition by such as visual check, an electron microscope, an optical microscope, EPMA (electron probe microanalizer), or XPS (X-ray photoelectron spectrometry).

The seed crystal will be described later in the column "B. Process for producing an artificial corundum crystal", and thus a description thereof is omitted herein.

It is sufficient in the embodiment that the artificial corundum crystal originates from a hexagonally dipyramidal crystal. The artificial corundum crystal may have a crystal face other than the above-mentioned crystal faces.

The wording "originates from a hexagonally dipyramidal crystal" means that the artificial corundum crystal of the embodiment may be an artificial corundum crystal having a hexagonally dipyramidal shape as its basic shape or may be a crystal obtained by applying cutting or some other processing to a hexagonally dipyramidal artificial corundum crystal.

The wording "having a hexagonally dipyramidal shape as its basic shape" means a hexagonally dipyramidal artificial corundum crystal as shown in, for example, FIG. 1A, or an artificial corundum crystal in which one or more parts of a hexagonal dipyramid are chipped so that one or more different crystal faces make its/their appearance as shown in FIG. 1B.

The artificial corundum crystal of the embodiment may be colorless, or may be colored by adding, to an artificial corundum crystal, at least one element selected from the group consisting of such as an iron, a titanium, a nickel, a vanadium or a cobalt. When the artificial corundum crystal has been colored, the combination of the elements described above is not particularly limited, and examples include nickel only, vanadium only, cobalt only, or combinations of ion/titanium, nickel/titanium/iron.

The artificial corundum crystal in this embodiment may have chromium added as a coloring component. A dark red corundum crystal having chromium added thereto in this way is generally called ruby, and a corundum crystal other than this dark red corundum crystal to which chromium is added is generally called sapphire. Naturally occurring ruby has high scarcity value, and thus the artificial corundum crystal to which chromium is added can be said to have high added value.

In this case, there is no particular limitation as long as chromium is added as a coloring component, and at least one element selected from the group consisting of an iron, a titanium, a nickel, a vanadium and a cobalt may also be added as another coloring component. The combination of chromium and at least one element selected from an iron, a titanium, a nickel, a vanadium and a cobalt is not particularly limited, and examples include combinations of chromium/nickel, chromium/nickel/iron, chromium/titanium/iron, or the like.

It is known that a corundum crystal turns to a crystal having a different hue in accordance with the kind of the additive such as an iron, a titanium, a nickel, a vanadium, a cobalt, or a chromium. For example, the crystal to which no additive is added is colorless; the crystal to which iron and titanium are added is blue; the crystal to which nickel is added is yellow; the crystal to which vanadium is added is alexandrite color; the crystal to which nickel, titanium and iron are added is yellowish green; the crystal to which cobalt is added is green; the crystal to which chromium is added is dark red, red or pink; the crystal to which chromium and nickel, or chromium, nickel and iron are added is orange; and the crystal to which chromium, titanium, and iron are added is purple. In this embodiment, the artificial corundum crystal having the above-mentioned hue can be obtained by combining plural kinds of elements as described above.

It can be identified with/by EPMA (electron probe microanalizer), XPS (X-ray photoelectron spectrometry) or EDX (energy dispersive X-ray analysis), that a chromium, an iron, a titanium, a nickel, a vanadium, a cobalt or the like is added.

The content of chromium, iron, titanium, nickel, vanadium or cobalt in the artificial corundum crystal may be very small and is not particularly limited as long as such element is contained in an amount to color the artificial corundum crystal.

In the embodiment, any one of the artificial corundum crystals is not limited to a crystal having a stoichiometric composition, and may be a crystal not having a stoichiometric composition. The artificial corundum crystal of the embodiment is preferably produced by the flux evaporation method, as will be described later, for the following reason: when the artificial corundum crystal is produced by the flux evaporation method, the crystal may contain, as an impurity, an element contained in the flux. The impurity content in the artificial corundum crystal is usually an extremely small amount which is 1% or less by mol.

In the embodiment, the artificial corundum crystal is preferably produced by the flux evaporation method for the following reasons: the apparatus used in the flux evaporation method is simply composed of a high-temperature furnace and a crucible, and thus a hexagonally dipyramidal artificial corundum crystal can easily be provided; in accordance with the kind of the used flux, it is possible not to produce a tabular crystal or needle crystal but to produce a hexagonally dipyramidal crystal selectively; and the artificial corundum crystal produced by the flux evaporation method may contain, as an impurity, an element contained in the flux as described above, and thus a crystal containing the impurity can be produced in the same manner as in the case of natural corundum, whereby the artificial corundum crystal has an advantage that the crystal is high in value as an ornament or the like since the crystal is near natural crystal.

The process for producing the artificial corundum crystal, such as the flux evaporation method, will be described later in the column "B. A process for producing an artificial corundum crystal". Thus, description thereof is not repeated herein.

The artificial corundum crystal of the embodiment may be a crystal into which an impurity is intentionally incorporated. As described above, the incorporation of the impurity gives an advantage that the crystal can be made near to natural crystal and is high in value as an ornament or the like.

2. Second Embodiment

The artificial corundum crystal of the second embodiment in the present invention contains a seed crystal and has a dominant crystal face other than a {001} face.

As described about the first embodiment, the artificial corundum crystal conventionally produced by the Czochralski method, the flame fusion method or the sintering method does not have any complicated crystal shape. Since the flux slow-cooling method gives a tabular crystal, the artificial corundum crystal has crystal faces; however, the dominant crystal face thereof is a {001} face.

The artificial corundum crystal of the present embodiment is an artificial corundum crystal having a dominant crystal face other than a {001} face. Such a crystal face does not originate from any tabular crystal, but originates from a hexagonally dipyramidal crystal in the same manner as in the first embodiment. Since the artificial corundum crystal in the embodiment has a dominant crystal face other than a {001}face and originates from a hexagonally dipyramidal crystal, cutting or any other processing is not applied thereto when the crystal is used as a laser-oscillating material, ornament or the like. Alternatively, even if cutting or any other processing is applied thereto, the embodiment has an advantage that the processing can be performed by use of the crystal face(s) which the artificial corundum crystal of the invention has, so that the crystal can be put into practical use at low costs. Further, the artificial corundum crystal of the invention contains a seed crystal and can be produced by using the seed crystal to produce a large-sized crystal.

The wording "having a dominant crystal face other than a {001} face" means the matter of having no {001} face, or the following: when a crystal has a {001} face, a peak is present which has a larger intensity than the peak assigned to the {001} face in the X-ray diffraction pattern thereof. The dominant crystal face other than a {001} face is preferably any one of the given crystal faces described about the first embodiment.

The other matters of the artificial corundum crystal are the same as described about the first embodiment. Thus, description thereof is not repeated herein.

B. A Process for Producing an Artificial Corundum Crystal

Next, the following describes the process for producing an artificial corundum crystal of the invention.

The process for producing an artificial corundum crystal of the invention is characterized in that an artificial corundum crystal having a hexagonally dipyramidal shape as its base shape is formed with a seed crystal by a flux evaporation method of heating a sample containing a raw material and a flux to precipitate a crystal and grow the crystal by use of flux evaporation as a driving force.

The flux method is one of the solution methods, and is also called the fusing agent method. When a crystal is grown by the flux method, an appropriate salt or oxide which becomes the flux is mixed with a raw material which becomes a solute and then the mixture is heated and melted. Thereafter, the solution is turned into a supersaturated state while the solution is slowly cooled or the flux is vaporized. In this way, a crystal is grown. In accordance with difference in the method for producing this super saturated state, the flux method is roughly classified into the flux evaporation method, the flux slow-cooling method, and the flux temperature gradient method.

Figure 5B:
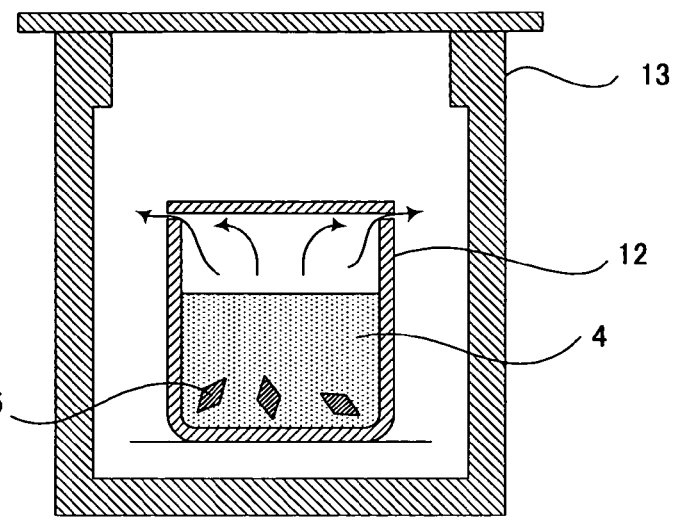
Figure 5C:
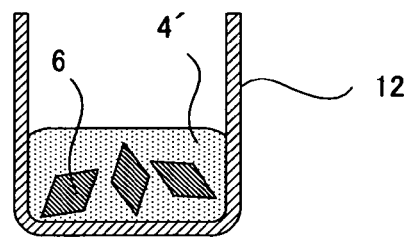

Among those described above, the flux evaporation method is used in the invention. The flux evaporation method is a method of promoting crystal growth by use of the evaporation of a flux as driving force, and as shown in, for example, FIG. 5B, a crucible 12 displaced with a sample 4 containing a flux and a raw material and with a seed crystal 5 is arranged in a high-temperature furnace 13, and then heated to vaporize the flux in the sample 4, thereby precipitating and growing a crystal with the seed crystal 5 as a nucleus, whereby a sample 4' containing an artificial corundum crystal 6 is obtained as shown as shown in FIG. 5C. This remaining sample 4' is dissolved in an appropriate medium, whereby the artificial corundum crystal 6 can be separated.

The following is known as the process for producing an artificial corundum crystal using the flux method: by the flux slow-cooling method, in which a solution is turned into a supersaturated state while the solution is slowly cooled, a crystal is grown and a tabular crystal can be obtained, using a lead-based flux such as lithium oxide-lead oxide (fluoride), lithium oxide-tungsten oxide-lead oxide (fluoride), or bismuth oxide-lanthanum oxide-lead oxide (fluoride). However, the crystal obtained by this method is only a thin tabular crystal. Thus, a large-sized crystal having a high quality is not easily produced. It is therefore necessary to cut the tabular crystal into a desired shape when the crystal is used as a laser-oscillating material or the like. Furthermore, an inconvenient that costs increase is caused since the artificial corundum crystal has a high hardness.

Although the flux method has such a problem, an element contained in a flux may be contained as an impurity in the crystal according to the flux method. Unlike the Czochralski method and so on, the resultant artificial corundum crystal contains the impurity, and can be made near to natural corundum crystal; thus, the flux method has an advantage that the resultant crystal is high in value as an ornament or the like.

In the invention, the flux evaporation method is used, whereby an artificial corundum crystal having a hexagonally dipyramidal shape as its basic shape can be produced, as shown in, for example, FIG. 1A. It is accordingly possible to provide, at low costs, a high value added artificial corundum crystal which is easily processed when the crystal is put into practical use. By using a seed crystal, the crystal can grow with the seed crystal as a nucleus, thus enabling production of a large-sized crystal in a short time. It is sufficient that the apparatus used in the flux evaporation method has a high-temperature furnace 13 and a crucible 12 as shown in FIG. 5B. Thus, the apparatus is simple. In the flux evaporation method, an artificial corundum crystal is obtained by vaporizing a flux to precipitate and grow a crystal, and then dissolving the remaining sample into an appropriate medium. Consequently, the production process therefor is simple. As described above, an artificial corundum crystal may contain, as an impurity, an element contained in the flux according to the flux evaporation method, and thus a crystal near natural corundum crystal is obtained. Therefore, an artificial corundum crystal high in value as an ornament or the like can be produced.

In the invention, the artificial corundum crystal having a hexagonally dipyramidal shape as its basic shape may be not only a hexagonally dipyramidal crystal as shown in FIG. 1A, but also a crystal in which one or some parts of a hexagonally dipyramidal shape are chipped so that one or more different crystal faces make its/their appearance as shown in FIG. 1B.

Figure 5D:
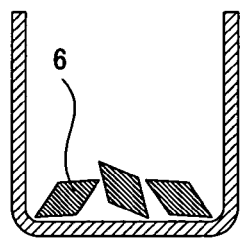

FIGS. 5A to 5D is a process chart showing an example of the process for producing an artificial corundum crystal according to the invention. As shown in FIGS. 5A to 5D, the process for producing an artificial corundum crystal according to the invention comprises a sample-preparing step of stirring a flux and a raw material in a mortar 11 to prepare a sample 4 (FIG. 5A); a heating/vaporizing step of setting a crucible 12 displaced with the sample 4 and a seed crystal 5 into a high-temperature furnace 13, heating, and further keeping the sample at high temperature to vaporize the flux (FIG. 5B); a cooling step of cooling the sample 4' fused in the heating/vaporizing step (FIG. 5C); and a separating step of dissolving a sample 4' remained after the heating/vaporizing step and the cooling step into an appropriate medium so as to separate an artificial corundum crystal 6 (FIG. 5D).

The following describes each of the steps of such a process for producing an artificial corundum crystal.

1. Sample-Preparing Step

In the process for producing an artificial corundum crystal of the invention, the sample-preparing step is performed first, in which a flux and a raw material are stirred to prepare a sample.

In the present step, the method for stirring the flux and the raw material is not particularly limited as long as the method is a method making it possible to stir them into a homogeneous form. For example, a method of sufficiently stirring the flux and the raw material in a mortar can be used.

The sample used in the invention is a sample containing a flux and a raw material. The following describes the flux and the raw material separately.

(1) Flux

The flux used in the invention is not particularly limited if the flux is a substance which evaporates in the heating/vaporizing step which will be described later, and which is dissolved in an appropriate medium in the separating step which will be also described later. The flux preferably contains a molybdenum compound. When the flux contains the molybdenum compound, it is possible not to produce a tabular or needle artificial corundum crystal but to produce selectively an artificial corundum crystal having a hexagonally dipyramidal shape as its basic shape.

As such a molybdenum compound, there can be used the molybdenum oxide, or a compound which is heated in the heating/vaporizing step, which will be described later, to generate the molybdenum oxide. Examples of the compound, which is heated to generate the molybdenum oxide, include a molybdenum carbonate, a molybdenum sulfate, a molybdenum nitrate, a molybdenum hydroxide, and hydrates thereof. Of these, the molybdenum oxide is preferably used in the invention.

In the invention, the flux may contain an evaporation inhibitor. This makes it possible to inhibit the evaporation speed of the flux to suppress the generation of polynuclei and the speed of crystal growth, whereby a high-quality artificial corundum crystal can be produced.

The evaporation inhibitor is not particularly limited if the inhibitor is a substance which can inhibit the evaporation of the flux and is dissolved in an appropriate medium in the separating step, which will be described later.

In the invention, it is preferred to use an alkali metal compound. The use of the alkali metal compound makes it possible to inhibit the evaporation of the flux effectively and produce a high-quality and large-sized artificial corundum crystal.

As such an alkali metal compound, there can be used an alkali metal oxide or a compound which is heated in the heating/vaporizing step, which will be described later, to generate the alkali metal oxide. Examples of the compound, which is heated to generate the alkali metal oxide, include an alkali metal carbonate, an alkali metal sulfate, an alkali metal nitrate, an alkali metal hydroxide, and hydrates thereof. In the invention, preferred is at least one kind of alkali metal oxide selected from the group consisting of $Li_2O$, $Na_2O$ and $K_2O$ among the above. Specifically, $Li_2CO_3$, $Na_2CO_3$, $K_2CO_3$ or the like can be cited.

About the content of the alkali metal compound, the mol number of the alkali metal atom in the alkali metal compound is preferably 40% or less by mol of the total mol number of the sample; more preferably 30% or less by mol thereof; and in particular preferably 20% or less by mol thereof. In the invention, crystal growth is promoted by use of the evaporation of the flux as a driving force; therefore, if the content of the alkali metal compound is larger than the above-mentioned range, the crystal growth may be hindered.

(2) Raw Material

The following describes the raw material used in the invention. The raw material used in the invention is varied depending on additives in the artificial corundum crystal as described in the above-mentioned column "A. Artificial corundum crystal". For example, when a colorless artificial corundum crystal is formed, the raw material may be an aluminum compound. When an iron and titanium-added artificial corundum crystal is formed, the raw material used is an aluminum compound, an iron compound and a titanium compound. For example, when a chromium-added artificial corundum crystal is formed, the raw material may be an aluminum compound and a chromium compound. Further for example, when a chromium and nickel-added artificial corundum crystal is formed, the raw material used is an aluminum compound, a chromium compound and a nickel compound.

The following describes, as examples, the colorless artificial corundum crystal, the iron and titanium-added artificial corundum crystal, and the chromium-added artificial corundum crystal.

(Colorless Artificial Corundum Crystal)

When the colorless artificial corundum crystal is formed in the invention, the raw material may be an aluminum compound.

As the aluminum compound, there can be used an aluminum oxide, or a compound which is heated in the heating/vaporizing step, which will be described later, to generate the aluminum oxide. Examples of the compound, which is heated to generate the aluminum oxide, include an aluminum hydroxide, an aluminum sulfate, an aluminum carbonate, an aluminum nitrate, and hydrates thereof. Of these, the aluminum oxide is preferably used in the invention.

About the content of the raw material in the invention, the mol number of the raw material is preferably 10% or less by mol of the total mol number of the sample. If the content of the raw material is larger than this range, the flux is not easily dissolved so that the crystallization may be hindered. Since the crystal is formed as long as the raw material is contained by only a small amount, the lower limit of the content of the raw material is not particularly limited.

(Iron and Titanium-Added Artificial Corundum Crystal)

When the iron and titanium-added artificial corundum crystal is formed, the raw material used in the invention is an aluminum compound, an iron compound and a titanium compound.

The iron compound is not particularly limited if the compound is a compound which is melted in the heating/vaporizing step, which will be described later. The compound is preferably a compound which is heated to generate an iron ion. Examples of the compound, which is heated to generate an iron ion, include an iron oxide, an iron hydroxide, an iron sulfate, an iron carbonate, an iron nitrate, an iron chloride, an iron citrate, an iron phosphate, an iron fluoride, an iron iodide, an iron oxalate, and hydrates thereof. Of these, the iron oxide is preferably used in the invention. In this case, the valence of iron in the iron oxide may be bivalent or trivalent. Bivalent iron and trivalent iron may be mixed.

Further, the titanium compound is not particularly limited if the compound is a compound which is melted in the heating/vaporizing step, which will be described later. The compound is preferably a compound which is heated to generate a titanium ion. Examples of the compound, which is heated to generate a titanium ion, include a titanium oxide, a titanium nitride, a titanium tetraisopropoxide, a titanium oxalate, a titanium sulfide, a titanium bromide, a titanium chloride, and hydrates thereof. Of these, the titanium oxide is preferably used in the invention. In this case, the valence of a titanium in the titanium oxide includes bivalence, trivalence and quadrivalence. About the valence of the titanium, a single valence or mixed valences therefrom are permissible.

The mixing ratio between the aluminum compound, and the iron compound and the titanium compound is not particularly limited if the iron compound and the titanium compound are added in an amount which makes it possible to color the corundum crystal. In the case of using, for example, an aluminum oxide, and an iron oxide and a titanium oxide as the raw material, the total adding amount of the iron oxide and the titanium oxide should be 5% or less by weight of the aluminum oxide weight; preferably 2% or less by weight thereof; and more preferably 1% or less by weight thereof. By setting the mixing ratio into the above-mentioned range, the artificial corundum crystal is colored into vivid blue color.

The mixing ratio between the iron compound and the titanium compound is varied by the valences of the iron and the titanium. Usually, the compounds are mixed to set the weight ratio between the iron element and the titanium element as follows: Fe:Ti=1:0.05-20. The compounds are preferably mixed to set the ratio to 1:0.07-15, in particular, 1:0.1-10. By setting the mixing ratio into the above-mentioned range, an artificial corundum crystal exhibiting vivid blue color can be obtained.

The content of the aluminum compound and the raw material is the same as described in the above-mentioned column of the colorless artificial corundum crystal. Thus, description is not repeated herein.

(Chromium-Added Artificial Corundum Crystal)

When the chromium-added artificial corundum crystal is formed, the raw material used in the invention is an aluminum compound and a chromium compound.

The chromium compound is not particularly limited if the compound is a compound which is melted in the heating/vaporizing step, which will be described later. The compound is preferably a compound which is heated to generate a chromium ion. Examples of the compound, which is heated to generate a chromium ion, include a chromium oxide, a chromium hydroxide, a chromium sulfate, a chromium carbonate, a chromium nitrate, and hydrates thereof. Of these, the chromium oxide is preferably used in the invention.

The mixing ratio of the aluminum compound to the chromium compound is not particularly limited as long as the chromium compound is added in an amount to color the artificial corundum crystal. In the case of using, for example, an aluminum oxide and a chromium oxide as the raw material, the adding amount of the chromium oxide should be 5% or less by weight of the aluminum oxide weight. The amount is preferably 2% or less by weight thereof, and more preferably 1% or less by weight thereof. This is because when the mixing ratio is in the above range, the artificial corundum crystal is colored into vivid dark red.

About the mixing ratio between the aluminum compound and the raw material, it is the same as the ratio described in the above-mentioned column of the colorless artificial corundum crystal. Thus, description is not repeated herein.

(Other)

When a nickel-, vanadium- or cobalt-added artificial corundum crystal is formed in the invention, a nickel compound, a vanadium compound or a cobalt compound may be used.

When an artificial corundum crystal to which chromium and at least one kind of element selected from the group consisting of an iron, a titanium, a nickel, a vanadium and a cobalt were added is formed in the invention, an iron compound, a titanium compound, a nickel compound, a vanadium compound or a cobalt compound may be used in addition to the above-mentioned aluminum compound and chromium compound.

The nickel compound is not particularly limited if the compound is a compound which is melted in the heating/vaporizing step, which will be described later. The compound is preferably a compound which is heated to generate a nickel ion. Examples of the compound, which is heated to generate a nickel ion, include a nickel acetate, a nickel carbonate, a nickel chloride, a nickel hydroxide, a nickel iodide, a nickel nitrate, a nickel oxide, a nickel sulfaminate, a nickel sulfate, and hydrates thereof. Of these, the nickel oxide is preferably used in the invention. In this case, the valence of the nickel in the nickel oxide may be bivalent or trivalent. Bivalent nickel and trivalent nickel may be mixed.

Further, the vanadium compound is not particularly limited if the compound is a compound which is melted in the heating/vaporizing step, which will be described later. The compound is preferably a compound which is heated to generate a vanadium ion. Examples of the compound, which is heated to generate a vanadium ion, include a vanadium carbide, a vanadium chloride, a vanadium oxide, a vanadium oxysulfate, a vanadium oxalateoxidehydrate, and hydrates thereof. Of these, the vanadium oxide is preferably used in the invention. In this case, the valence of the vanadium in the vanadium oxide includes trivalence, quadrivalence and quinquevalence. About the valence of vanadium, a single valence or mixed valences there from are permissible.

Moreover, the cobalt compound is not particularly limited if the compound is a compound that is melted in the heating/vaporizing step, which will be described later. The compound is preferably a compound which is heated to generate a cobalt ion. Examples of the compound, which is heated to generate a cobalt ion, include a cobalt bromide, a cobalt chloride, a cobalt citrate, a cobalt fluoride, a cobalt gluconate, a cobalt hydroxide, a cobalt iodide, a cobalt nitrate, a cobalt oxalate, a cobalt oxide, a cobalt phosphate, a cobalt stearate, a cobalt sulfate, a cobalt sulfide, and hydrates thereof. Of these, the following are preferably used in the invention: the cobalt citrate, the cobalt fluoride, the cobalt gluconate, the cobalt hydroxide, the cobalt iodide, the cobalt oxalate, the cobalt oxide, the cobalt phosphate, and the cobalt stearate. It is particularly preferred to use the cobalt oxide, the cobalt hydroxide, the cobalt stearate and the cobalt phosphate. In this case, the valence of cobalt in the cobalt compound may be bivalent or trivalent. A bivalent cobalt and a trivalent cobalt may be mixed.

The amount of the nickel compound, vanadium compound, cobalt compound, iron compound or titanium compound described above is not particularly limited as long as the compound is added in an amount to color the artificial corundum crystal.

In the invention, the above-mentioned aluminum compound can be used in combination with the iron compound, titanium compound, nickel compound, vanadium compound or cobalt compound in various ways, and the mixing ratio between these compounds is suitably selected depending on applications of the artificial corundum crystal.

The above-mentioned aluminum compound and chromium compound can be used in combination with an iron compound, a titanium compound, a nickel compound, a vanadium compound or a cobalt compound in various ways, and the mixing ratio between these compounds is appropriately selected depending on applications of the artificial corundum crystal.

(3) Others

In the invention, an impurity may be contained into the above-mentioned sample. This makes it possible to produce a crystal near natural crystal and yield an artificial corundum crystal high in value as an ornament or the like.

2. Heating/Vaporizing Step

The following describes the heating/vaporizing step in the process for producing an artificial corundum crystal of the invention. The heating/vaporizing step in the invention is a step of heating the sample containing the flux and the raw material, and the seed crystal; and further keeping them at high temperature to vaporize the flux.

In the present step, the sample prepared in the sample-preparing step and a seed crystal are displaced into a crucible, and then the crucible is covered with a lid, and as shown in, for example, FIG. 5B, a crucible 12 into which a sample 4 and a seed crystal 5 are displaced is set in a high-temperature furnace 13. Then, the temperature thereof is raised to a maximum keeping temperature, and the sample is kept at the temperature for a predetermined time, thereby vaporizing the flux in the sample 4 and promoting crystal growth by use of the evaporation of the flux as driving force. In this way, a crystal grows with the seed crystal 5 as a nucleus in the sample 4.

The seed crystal used in the invention is not particularly limited as long as it is a corundum crystal, and the seed crystal may be a natural corundum crystal or an artificial corundum crystal. The seed crystal may or may not have a crystal face, but preferably has a crystal face. The crystal face is preferably a dominant crystal face other than a {001} face, and is particularly preferably at least one crystal face selected from the group consisting of a {113} face, a {012} face, a {104} face, a {110} face, a {101} face, a {116} face, a {211} face, a {122} face, a {214} face, a {100} face, a {125} face, a {223} face, a {131} face, and a {312} face. This is because when the seed crystal has the above-mentioned crystal face, a crystal can grow by inheriting the crystal face of the seed crystal, and thus affording an artificial corundum crystal having the above-mentioned crystal face.

The component in the seed crystal may be the same as, or different from, that of a desired artificial corundum crystal. When the seed crystal has the same component as in a desired artificial corundum crystal, an artificial corundum crystal having the same hue as that of the seed crystal can be obtained. On the other hand, when the seed crystal has a component different from that of a desired artificial corundum crystal, a crystal different in hue from the seed crystal can grow to yield an artificial corundum crystal having a partially different hue. For example, when an iron and titanium-added artificial corundum crystal is used as the raw material and a colorless corundum crystal is used as the seed crystal, the resultant artificial corundum crystal has both colorless and colored portions. Usually, a seed crystal having the same component as in a desired artificial corundum crystal shall be used in the invention.

When the seed crystal has the same component as in a desired artificial corundum crystal, the composition of the seed crystal may be the same as, or different from, that of the desired artificial corundum crystal. For example, when the composition of the seed crystal is different from that of the desired artificial corundum crystal, a crystal identical in hue with the seed crystal but different in color density from the seed crystal can grow to afford an artificial corundum crystal having partially different color density.

The shape of the seed crystal used in the invention is not particularly limited as long as it has the above-mentioned crystal face(s), and the seed crystal particularly preferably has a hexagonally dipyramidal shape as its basic shape. By using the seed crystal having a hexagonally dipyramidal shape as its basic shape, an artificial corundum crystal having a hexagonally dipyramidal shape as its basic shape can be selectively produced. The wording "having a hexagonally dipyramidal shape as its basic shape" means that the seed crystal may be a crystal having a hexagonally dipyramidal shape as shown in, for example, FIG. 1A, or may be a crystal having a hexagonally dipyramidal shape partially chipped to allow another crystal face(s) to appear as shown in FIG. 1B.

Because the artificial corundum crystal having a hexagonally dipyramidal shape as its basic shape can be produced selectively by using the above-mentioned flux in the invention, it is estimated that when a crystal having a hexagonally dipyramidal shape partially chipped to allow another crystal face(s) to appear as shown in, for example, FIG. 1B, is used, a crystal will grow in a direction for adjusting the chipped hexagonally dipyramidal shape.

The size of the seed crystal is not particularly limited and is suitably selected depending on the objective artificial corundum crystal.

The content of the seed crystal in the sample is not particularly limited, and usually, several seed crystals shall be mixed in the sample. This is because, when the number of seed crystals is too large, a large-sized artificial corundum crystal is hardly produced in some cases.

The method of arranging the seed crystal and the sample in the crucible in the invention is not particularly limited as long as the seed crystal can be mixed in the sample by the method. The seed crystal may be arranged simultaneously with the sample in the crucible, or may be mixed in the sample after the crucible filled with the sample is heated to a certain extent.

The maximum keeping temperature in the step is not particularly limited if the temperature is a temperature at which the sample is melted. Specifically, the temperature is preferably from 950 to 1300° C.; more preferably from 975 to 1250° C.; and in particular preferably from 1000 to 1200° C.

The temperature-raising rate when the maximum keeping temperature is set is not particularly limited if the rate is a rate making it possible to heat the sample uniformly. Furthermore, the time for keeping the sample at the maximum keeping temperature is not particularly limited if the time is a time making it possible to grow the crystal sufficiently.

The crucible used in the step is not particularly limited if the crucible is a crucible which can resist the maximum keeping temperature. Usually, a platinum crucible is used.

3. Cooling Step

The following describes the cooling step in the process for producing an artificial corundum crystal of the invention. The cooling step in the invention is a step of cooling the sample melted in the heating/vaporizing step.

In the step, the crucible 12 displaced with the sample 4 and seed crystal 5 is taken out from the high-temperature furnace 13 as shown in, for example, FIG. 5B, and then the crucible 12 displaced with the sample 4' is cooled to a room temperature, as shown in FIG. 5C.

The method for the cooling may be any method that makes it possible to cool the sample to a room temperature, and is a method of cooling the crucible naturally, or the like.

4. Separating Step

The following describes the separating step in the process for producing an artificial corundum crystal of the invention. The separating step in the invention is a step of dissolving the sample remaining after the heating/vaporizing step and the cooling step into an appropriate medium, thereby separating the crystal.

After the cooling step, a sample 4' in which the artificial corundum crystal 6 is taken in remains the crucible, as shown in FIG. 5C. In the step, this remaining sample is dissolved into an appropriate medium, whereby only the artificial corundum crystal can easily be separated.

The medium used to dissolve the remaining sample is not particularly limited if the medium is a medium in which the remaining sample other than the artificial corundum crystal can be dissolved without affecting the artificial corundum crystal. Examples thereof include cool water, warm water, and hot water.

Other matters of the artificial corundum crystal produced by the invention are the same as described in the column "A. Artificial corundum crystal". Thus, description thereof is not repeated herein.

The invention is not limited to the above-mentioned embodiments. The embodiments are illustrative, and any embodiment which has a construction which is substantially equivalent to the technical conception recited in the claims of the invention and produces similar effects or equivalent thereof is included in the technical scope of the invention.

EXAMPLES

The invention will be specifically described by way of working examples and comparative examples hereinafter.

Comparative Example 1

An aluminum oxide (1.5 g), a titanium oxide (0.002 g), an iron oxide (0.002 g), a molybdenum oxide (28.5 g), and a lithium carbonate (1.5 g) were weighed, and then put into a mortar. This blended sample was dry-mixed in the mortar for about 20 minutes. Thereafter, the blended sample was filled into a platinum crucible, and the crucible was covered with a lid to be set into an electric furnace. The electric furnace was heated to 1100° C. at a rate of 45° C. per hour, and kept at the temperature for 5 hours. After the furnace was kept, the crucible was taken out from the electric furnace, and naturally cooled to room temperature. The crucible cooled to room temperature was put into warm water to separate/collect a titanium and iron-added artificial corundum crystal. The resultant crystal had a three-dimensional shape having a hexagonally dipyramidal shape as its basic shape, and was transparent and blue.

Example 1

An aluminum oxide (1.5 g), a titanium oxide (0.002 g), an iron oxide (0.002 g), a molybdenum oxide (28.5 g), and a lithium carbonate (1.5 g) were weighed, and then put into a mortar. This blended sample was dry-mixed in the mortar for about 20 minutes. Thereafter, the blended sample was filled into a platinum crucible, and 3 titanium and iron-added artificial corundum crystals (with a size of about 1 mm in each of "a" axis and "c" axis directions) prepared in the comparative example were filled as the seed crystals into the crucible, and the crucible was covered with a lid to be set into an electric furnace. The electric furnace was heated to 1100° C. at a rate of 45° C. per hour, and kept at the temperature for 5 hours. After the furnace was kept, the crucible was taken out from the electric furnace, and naturally cooled to room temperature. The crucible cooled to room temperature was put into warm water to separate/collect a titanium and iron-added artificial corundum crystal. The resultant crystal had a three-dimensional shape having a hexagonally dipyramidal shape as its basic shape, and was transparent and blue. The crystal containing this seed crystal grew to be larger in each of "a" axis and "c" axis directions than the seed crystal.

Comparative Example 2

First, an aluminum oxide (1.5 g), a chromium oxide (0.008 g), a molybdenum oxide (28.5 g), and lithium carbonate (1.5 g) were weighed, and then put into a mortar. This blended sample was dry-mixed in the mortar for about 20 minutes. Thereafter, the blended sample was filled into a platinum crucible, and the crucible was covered with a lid to be set into an electric furnace. The electric furnace was heated to 1100° C. at a rate of 45° C. per hour, and kept at the temperature for 5 hours. After the furnace was kept, the crucible was taken out from the electric furnace, and naturally cooled to room temperature. The crucible cooled to room temperature was put into warm water to separate/collect a chromium-added artificial corundum crystal. The resultant crystal had a three-dimensional shape having a hexagonally dipyramidal shape as its basic shape, and was transparent and dark red. The average size thereof was about 1 mm in each of "a" axis and "c" axis directions.

Example 2

First, an aluminum oxide (1.5 g), a chromium oxide (0.008 g), a molybdenum oxide (28.5 g), and lithium carbonate (1.5 g) were weighed, and then put into a mortar. This blended sample was dry-mixed in the mortar for about 20 minutes. Thereafter, the blended sample was filled into a platinum crucible, and 3 chromium-added artificial corundum crystals (with a size of about 1 mm in each of "a" axis and "c" axis directions) prepared in the comparative example were filled as the seed crystals into the crucible, and the crucible was covered with a lid to be set into an electric furnace. The electric furnace was heated to 1100° C. at a rate of 45° C. per hour, and kept at the temperature for 5 hours. After the furnace was kept, the crucible was taken out from the electric furnace, and naturally cooled to room temperature. The crucible cooled to room temperature was put into warm water to separate/collect a chromium-added artificial corundum crystal. The resultant crystal had a three-dimensional shape having a hexagonally dipyramidal shape as its basic shape, and was transparent and dark red. The crystal containing this seed crystal grew to be larger in each of "a" axis and "c" axis directions than the seed crystal.

The invention claimed is:

1. An artificial corundum crystal containing a seed crystal and having at least one crystal face selected from the group consisting of a {113} face, a {012} face, a {104} face, a {110} face, a {101} face, a {116} face, a {211} face, a {122} face, a {214} face, a {100} face, a {125} face, a {223} face, a {131} face, and a {312} face, wherein a basic shape of the seed crystal is a hexagonally dipyramidal shape.

2. An artificial corundum crystal containing a seed crystal and having a dominant crystal face other than a {001} face, wherein a basic shape of the seed crystal is a hexagonally dipyramidal shape.

3. The artificial corundum crystal according to claim 1, wherein the artificial corundum crystal is derived from a crystal having a hexagonally dipyramidal shape.

4. The artificial corundum crystal according to claim 2, wherein the artificial corundum crystal is derived from a crystal having a hexagonally dipyramidal shape.

5. The artificial corundum crystal according to claim 1, wherein a chromium is added as a coloring component.

6. The artificial corundum crystal according to claim 2, wherein a chromium is added as a coloring component.

7. A process for producing an artificial corundum crystal, wherein an artificial corundum crystal having a hexagonally dipyramidal shape as its base shape is formed with a seed crystal by a flux evaporation method of heating a sample containing a raw material and a flux to precipitate a crystal and grow the crystal by use of flux evaporation as driving force, and wherein a basic shape of the seed crystal is a hexagonally dipyramidal shape.

8. The process for producing an artificial corundum crystal according to claim 7, wherein the flux contains a molybdenum compound.

9. The process for producing an artificial corundum crystal according to claim 8, wherein the molybdenum compound is a molybdenum oxide, or a compound which is heated to generate the molybdenum oxide.

10. The process for producing an artificial corundum crystal according to claim 8, wherein the flux contains an evaporation inhibitor.

11. The process for producing an artificial corundum crystal according to claim 10, wherein the evaporation inhibitor is an alkali metal compound.

12. The process for producing an artificial corundum crystal according to claim 11, wherein the alkali metal compound is an alkali metal oxide, or a compound which is heated to generate the alkali metal oxide.

13. The process for producing an artificial corundum crystal according to claim 12, wherein a mol number of an alkali metal atom in the alkali metal compound is 40% or less by mol of a total mol number of the sample.

14. The process for producing an artificial corundum crystal according to claim 7, wherein a mol number of the raw material is 10% or less by mol of a total mol number of the sample.

15. The process for producing an artificial corundum crystal according to claim 7, wherein the seed crystal is a corundum crystal.

16. The process for producing an artificial corundum crystal according to claim 7, wherein the raw material contains a chromium compound.

* * * * *